United States Patent [19]

Ogawa

[11] Patent Number: 5,293,347
[45] Date of Patent: Mar. 8, 1994

[54] SEMICONDUCTOR MEMORY DEVICE HAVING READ/WRITE OPERATION IMPROVED IN PIPE LINE PROCESSING

[75] Inventor: Toshiyuki Ogawa, Hyogo, Japan

[73] Assignee: Mitsubishi Denki Kabushiki Kaisha, Tokyo, Japan

[21] Appl. No.: 814,174

[22] Filed: Dec. 30, 1991

[30] Foreign Application Priority Data

Jan. 17, 1991 [JP] Japan .................. 3-003859

[51] Int. Cl.$^5$ .......................................... G11C 8/00
[52] U.S. Cl. ..................... 365/230.01; 365/189.01; 365/189.05; 365/230.06
[58] Field of Search ............ 365/230.01, 189.01, 365/189.05, 230.08, 238.5, 230.06

[56] References Cited

U.S. PATENT DOCUMENTS

| | | | |
|---|---|---|---|
| 4,541,076 | 9/1985 | Bowers et al. | 365/230.05 |
| 4,592,026 | 5/1986 | Matsukawa et al. | 365/233.5 |
| 4,597,061 | 6/1986 | Cline et al. | 365/189 |
| 4,685,088 | 8/0487 | Iannucci | 365/230 |
| 4,926,385 | 5/1990 | Fujishima et al. | 365/230.08 |
| 4,928,265 | 5/1990 | Higuchi et al. | 365/230.01 |
| 4,941,129 | 7/1990 | Oshima et al. | 365/230.03 |
| 5,083,296 | 1/1992 | Hara et al. | 365/230.08 |

OTHER PUBLICATIONS

"Innovative Chip Designs Lead to Dense, Superfast RAMs", Dave Bursky, Electronic Design, Aug. 18, 1983, pp. 97–110 and 104–112 (even).

*Primary Examiner*—Eugene R. LaRoche
*Assistant Examiner*—Son Dinh
*Attorney, Agent, or Firm*—Lowe, Price, LeBlanc & Becker

[57] ABSTRACT

A semiconductor memory device according to the present invention is a dynamic type semiconductor memory device carrying out pipe line processing in page mode, including two column decoders, two address latches, two preamplifiers and two write drivers for one memory cell array. A column address supplied from an address buffer is provided sequentially and alternately to each of the address latches, whereby one of the column decoders, one of the preamplifiers and so on corresponding to the address latch operate alternately.

12 Claims, 19 Drawing Sheets

SEMICONDUCTOR MEMORY DEVICE HAVING READ/WRITE OPERATION IMPROVED IN PIPE LINE PROCESSING

BACKGROUND OF THE INVENTION

1. Field of the Invention

The present invention relates to semiconductor memory devices, and more particularly, to a semiconductor memory device that carries out pipe line processing in page mode.

2. Description of the Background Art

FIG. 11 is a block diagram showing a structure of a conventional dynamic type semiconductor memory device.

Referring to FIG. 11, a dynamic type semiconductor memory device comprises a memory cell array 1 having a plurality of memory cells arranged in a matrix of rows and columns, a precharge circuit 2 for holding the potential of the bit line in memory cell array 1 at a predetermined potential at the time of reading, a sense amplifier 3 for amplifying the potential difference appearing on a bit line pair, an I/O control 4 for controlling read/-write operation, a column decoder 5 for selecting a desired bit line pair according to column address, a row decoder 6 for selecting a desired word line according to a row address, a preamplifier 7 for amplifying data read out to the bit line pair selected by column decoder 5, a write driver 8 for writing data into a memory cell connected to a desired bit line at the time of writing, an address buffer 9 where address data is entered, an output buffer 10 for providing data read out at the time of reading to an external source, a write buffer 11 for holding data input at the time of writing, a ½ Vcc generation circuit 12 for generating a potential that is ½ of the power supply potential, a timing signal generation circuit 13 for generating a desired timing signal according to control signals such as $\overline{RAS}$ and $\overline{CAS}$, an address latch 14 for latching the column address applied to address buffer 9, and an output data latch 15 for latching and providing data amplified by preamplifier 7.

FIG. 12 is a diagram showing a portion of memory cell array 1 and the peripheral circuit thereof in FIG. 11.

Referring to FIG. 12, a plurality of bit line pairs BLa and BLb, and word lines $X_0$–$X_3$ crossing the bit line pairs are arranged in memory cell array 1. A memory cell constituted by one set of a memory cell transistor and a capacitor is provided at each crossing of a bit line pair and a word line. Dummy word lines $DX_1$ and $DX_0$ are arranged in a direction crossing the bit line pairs, with a dummy cell constituted by one set of a memory transistor and a capacitor formed at each crossing of a dummy word line and a bit line pair. The word line and the dummy word line are connected to row decoder 6. One end of the bit line is connected to precharge circuit 2. Precharge circuit 2 is applied with an equalize signal EQ and a potential $V_{BL}$ for holding the potential of the bit line pair at a predetermined potential at the time of reading.

The other end of the bit line is connected to sense amplifier 3 and I/O control 4. In I/O control 4, IO buses IOa and IOb for connection to preamplifier 7 and write driver 8 are connected to one of the bit lines of each bit line pair. Transistors $Q_5$ and $Q_6$ are provided between the IO bus and the bit line pair. These transistors have the gates connected to column decoder 5.

The read operation of a memory cell will be explained briefly hereinafter with reference to FIG. 12.

According to the input row address, row decoder 6 selects a desired word line so that the corresponding word line attains a predetermined potential. This allows a memory cell to be selected located at the crossing of the selected word line and the bit line pair, whereby information charge held in that memory cell is read to one of the connected bit line pair. This potential is amplified by sense amplifier 3. Then, according to the input column address information, row decoder 5 selects a desired bit line pair. Transistors $Q_5$ and $Q_6$ in I/O control 4 of the selected bit line pair are turned on, so that the potentials appearing on the bit line pairs are transferred to data buses IOa and IOb, respectively, to be transferred to preamplifier 7 and read out.

The write operation will be explained hereinafter briefly.

At the time of writing, row recorder 5 selects a desired bit line pair according to row address information. Transistors $Q_5$ and $Q_6$ in I/O control 4 connected to the selected bit line pair are turned on so that data buses IOa and IOb are connected to the desired bit line pair. The data applied to write driver 8 is provided as the potential to each bit line of the desired bit line pair via the data bus. Then, row decoder 6 selects a desired word line according to the input row address so that the potential of the selected word line attains a predetermined potential. Thus, the memory transistor in the memory cell located at the crossing of the selected word line and the selected bit line pair is turned on, whereby the potential on the bit line is held in the capacitor of that memory cell to complete the write operation.

FIG. 13 is a diagram for explaining the operation of the relative circuits at a normal read out cycle after the specification of a row address in association with time. The timing chart below the figure shows the transition of each signal corresponding to the above diagram.

The elapse of time of the operation is plotted along the abscissa, and the operation of each component circuit is plotted along the ordinate. A portion of each signal is described in the block diagram of FIG. 11.

Data reading according to a column address is carried out after the data in the plurality of memory cells connected to the word line corresponding to the selected row address are amplified by sense amplifier 3.

In response to the change of signal $\overline{AL}$, a column address signal is supplied to and latched in address buffer 9 (0–5 ns). Then, the decoder portion in column decoder 5 corresponding to the column address operates to turn on the transistor in I/O control 4, whereby the potential difference appearing on the bit line pair is transmitted to preamplifier 7. Preamplifier 7 operates simultaneously with the data selection by column decoder 5 to amplify the data of the selected column which is transferred as the potential difference of the bit line. The amplified data is provided to output latch 15 (5–15 ns).

The data provided from preamplifier 7 is latched in output data latch 15. The read out data latched in output data latch 15 is provided to an outer terminal I/O via output buffer 10 (20–35 ns).

Thus, at the time of normal reading operation, reading operation is carried out according to the next new column address data, after the completion of one cycle from the latch of an column address to the output of the read out data.

FIG. 14 is a diagram for explaining the operation of each circuit in a normal writing cycle after the specification of a row address in association with time in a semiconductor memory device of FIG. 11.

Referring to FIG. 14, a column address provided to address buffer 9 is latched by address latch 14 (0–5 ns). Simultaneously, data provided from I/O terminal is supplied to write buffer 11 to be latched in data latch 16 in response to data latch signal $\overline{DL2}$ attaining an H level (0–5 ns).

Next, a desired column in the column decoder is selected according to the latched column address to turn on the desired transistor in I/O control 4 (5–15 ns). Simultaneously, the latched write data is transmitted to a data bus by write driver 8, whereby information charge is written into a desired memory cell via the selected bit line (5–15 ns).

In normal writing operation, a subsequent column address data is provided to carry out writing operation after the writing operation according to the input of one column address data is completed.

As described above in association with FIGS. 13 and 14, the reading operation and the writing operation are implemented with 1 cycle of the sequential operations of each component circuits. Therefore, pipe line processing can be carried out by providing a latch circuit for connecting the operations of these component circuits. Pipe line processing in a semiconductor memory device is contemplated to divide the processing steps of the read/write operation request into a plurality of small independent operationable steps for processing a plurality of operation requests subsequently. Corresponding to this definition of pipe line processing, a semiconductor memory device not pipe-lined can be considered a semiconductor memory device that establishes a state capable of receiving a subsequent request every time a reading/writing operation is completed as one step.

Therefore, in a semiconductor memory device that is not pipe-lined, the time period starting from the request of a read/write operation to the semiconductor memory device until the termination of that process (referred to as "memory access time" hereinafter) is substantially equal to a time interval allowing a read/write operation to be requested to a memory (referred to as "memory cycle time" hereinafter). On the other hand, in a semiconductor memory device that is pipe-lined, the memory cycle time is shorter than the memory access time, so that the throughput thereof is greater than that of a semiconductor memory device that is not pipe-lined to result in a reading/writing operation of high speed. This pipe line processing is particularly effective in a dynamic type semiconductor memory device carrying out page mode processing to realize high speed operation.

Page mode of a dynamic type semiconductor memory device will be explained hereinafter with reference to the time chart of FIG. 15.

The fall of external row address strobe signal $\overline{RAS}$ from the H level to the L level triggers a row address to be supplied. Next, the fall of column address strobe signal $\overline{CAS}$ from the H level to the L level causes a column address data Col-1 to be supplied. The data of the memory cell specified by the supplied row address and the column address is provided as data Dout-1 via I/O terminal. Signal $\overline{CAS}$ temporarily returns to the H level and then to the L level again to become active. At this time, address information Col-2 entered as the column address information is supplied to be output as data Dout-2 via I/O terminal. Thus by sequentially changing the level of signal $\overline{CAS}$, only the column address can be changed while the row address is held to read out data from a desired memory cell. The page mode processing is an operation that subsequently reads out data in memory cells connected to one word line selected by a row address by sequentially changing the column address, i.e. by switching the gate of an I/O control.

If pipe line processing can be carried out under page mode in a dynamic type semiconductor memory device, high speed operation in reading and the like can be expected.

FIG. 16 is a diagram explaining the operation of each circuit of reading operation carried out by pipe line processing in page mode processing, for example, in association with time in a semiconductor memory device of FIG. 11.

The fall of signal $\overline{CAS}$ triggers external column address A to be provided to address buffer 9 in response to the change of signal $\overline{AL}$, and then to be held in latch 14 (0–5 ns). Read out of columns corresponding to the column address latched in latch 14 is carried out by column decoder 5 (5–15 ns). Simultaneously, preamplifier 7 operates (5–15 ns), so that the read out data is latched in output latch 15 (20–25 ns). In pipe line processing, a new column address is provided to address buffer 9 to be latched in latch 14 in response to the change of signal $\overline{AL}$ as the subsequent read cycle, simultaneously with the latch of the output latch (20–25 ns). The output data already held in output latch 15 is output via output buffer 10. Simultaneously, the operation of the column decoder and the operation of the preamplifier of the next cycle are carried out in parallel (25–35 ns). Thus, memory cycle time Tc can be reduced with respect to memory access time Ta by providing a partial overlapping operation of a preceding reading cycle and a succeeding reading cycle.

FIG. 17 is a diagram describing the operation in association with time of each circuit when pipe line processing is employed in writing operation in a semiconductor memory device of FIG. 11.

Referring to FIG. 17, when an external column address is provided to address buffer 9 at the first cycle, the column address provided to latch circuit 14 is held therein in response to the change of signal $\overline{AL2}$ (10–15 ns). At the next cycle, column decoder 5 selects a desired bit line pair according to the column address latched at the preceding cycle (20–30 ns). The write data held in latch 16 from write buffer 11 is written by write driver 8 to a desired memory cell (20–30 ns). At the same time of these operations, an external column address is provided to address buffer 9 in response to the change of signal $\overline{AL}$ of the writing operation of the next cycle. Thus, memory cycle time Tc of a writing operation can be reduced by carrying out pipe line processing in writing operation.

FIG. 18 is a diagram for explaining the operation of each circuit in association with time when pipe line processing of another system is carried out at writing operation in the semiconductor memory device of FIG. 11.

This pipe line processing differs from that of FIG. 17 in that the column address information and write data are held in latches 14 and 16, respectively, in response to the changes of signals $\overline{AL}$ and $\overline{DL}$, respectively. Then at the next cycle, the column decoder operates according to the column address information and the write data held in the preceding cycle, whereby the operation of write driver 8 causes write data to be written into a desired memory cell.

Memory cycle time Tc of a writing operation can also be reduced as described above.

There is particularly no problem in the above described conventional semiconductor memory device carrying out pipe line processing under page mode when the writing operation and the reading operation are respectively continuous. The conventional semiconductor memory device has a disadvantage in operation cycles where the writing operation and the reading operation are alternately switched.

FIG. 19 is a diagram for explaining the operation of each circuit in association with time when the operation cycle changes from the write operation to the read operation in pipe processing in the semiconductor memory device shown in FIG. 11.

First, an external column address and an external data are supplied via address buffer 9 and write buffer 11 to be held in latches 14 and 16, respectively (10–15 ns). At the next cycle, the writing operation is carried out according to the latched column address and write data. Because the reading operation of the next cycle is also carried out at this time, preparation operation for the next reading operation is necessary in this cycle. More specifically, column address B for the reading operation must be provided via address buffer 9 to be latched in latch 14, whereby the column decoder and the preamplifier are operated according to this latched column address. However, firstly the column decoder for writing must be operated in this cycle. The operation of the column decoder must be carried out twice during the cycle of 20 ns–50 ns. These decoder operation can not be carried out simultaneously because there is only one column decoder in a conventional semiconductor memory device. It can not be helped that memory cycle time TA2 required for the first reading operation when changing from the writing operation to the reading operation is longer than memory cycle time TA1 or TA3 of a normal pipe line processing. In order to avoid delay of memory cycle time TA2, a step must be taken to cease the reading operation temporarily, i.e. to process the cycle succeeding the writing cycle as a dummy cycle.

It was therefore not possible to reduce the memory cycle time in switching even if pipe line processing is used in case where the writing operation and the reading operation are frequently switched alternately.

SUMMARY OF THE INVENTION

An object of the present invention is to achieve high speed operation in a semiconductor memory device.

Another object of the present invention is to prevent delay in the memory cycle in a semiconductor memory device.

A further object of the present invention is to facilitate the usage in a semiconductor memory device.

A semiconductor memory device according to the present invention for achieving the above objects is a semiconductor memory device having a plurality of memory cells arranged in a matrix of rows and columns for writing information into a memory cell corresponding to a specified row and column and for reading out information held in a corresponding memory cell, including: a row address buffer for receiving a row address; a row decoder for specifying an input row address; a column address buffer for providing a column address continuously with respect to the input row address; a first column address latch for holding one of the input column address; a first column decoder for specifying a column address held by the first column address latch; a second column address latch for holding a column address provided succeeding the column address held by the first column address latch; a second column decoder for specifying a column address held by the second address latch; a write driver for writing information into a memory cell corresponding to the specified row and column addresses; a preamplifier for reading out information for a memory cell corresponding to the specified row and column addresses; and a controller for operating the write driver or the preamplifier according to the first row and column addresses specified by the row decoder and the first column decoder, for enabling the second column address latch before the termination of the operation based on the specified first row and column addresses, and for operating the write driver or the preamplifier according to the second row and column addresses specified by the row decoder and the second column decoder after the termination of the operation based on the first row and column addresses.

A semiconductor memory device of the above-described structure can have the delay of the memory cycle prevented because the second column address latch is enabled before the termination of the operation based on the first row and column addresses.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
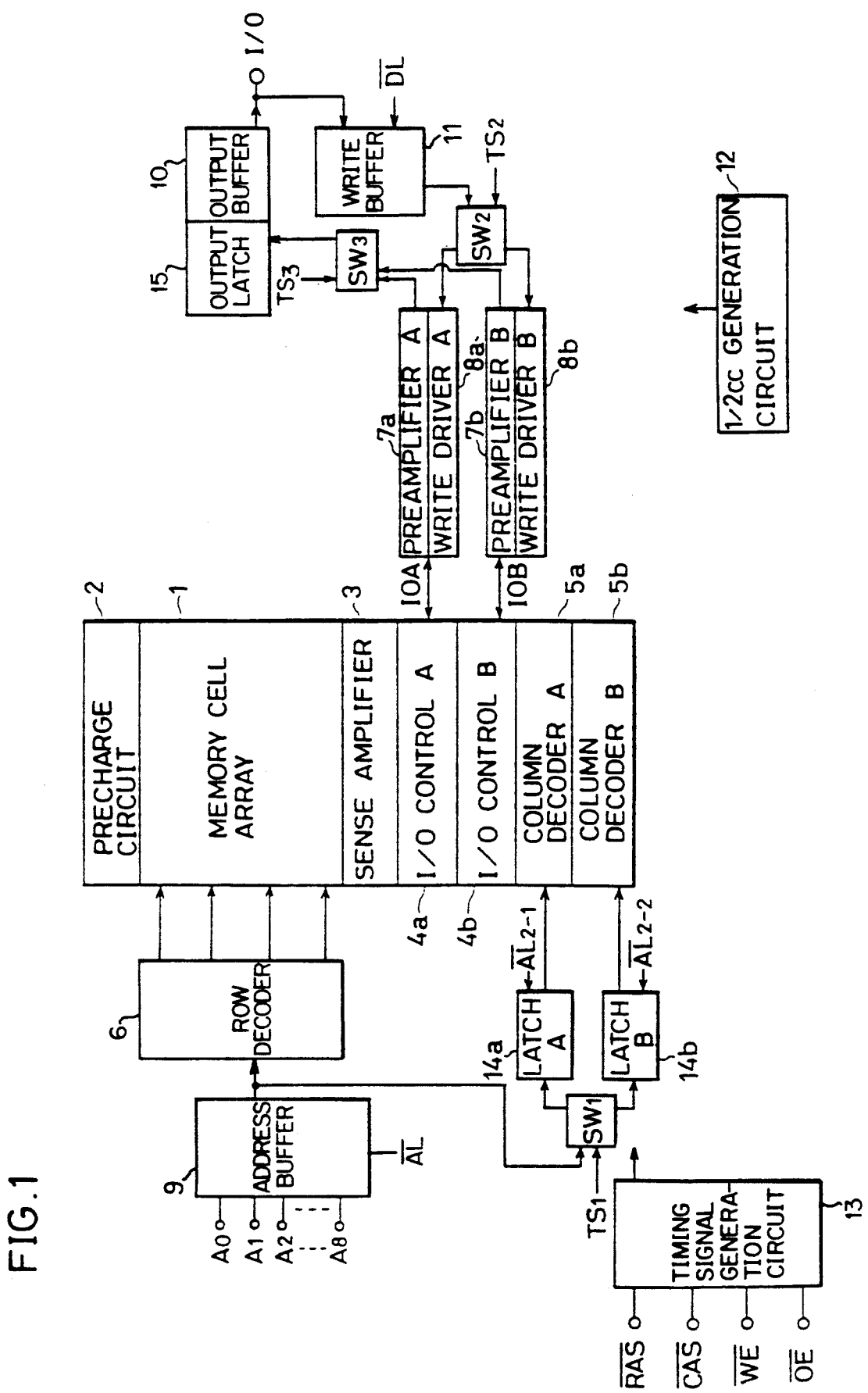
FIG. 1 is a block diagram showing the structure of a dynamic type semiconductor memory device of a first embodiment of the present invention.

FIG. 1 is a block diagram showing a structure of a dynamic type semiconductor memory device according to an embodiment of the present invention.

Figure 11:
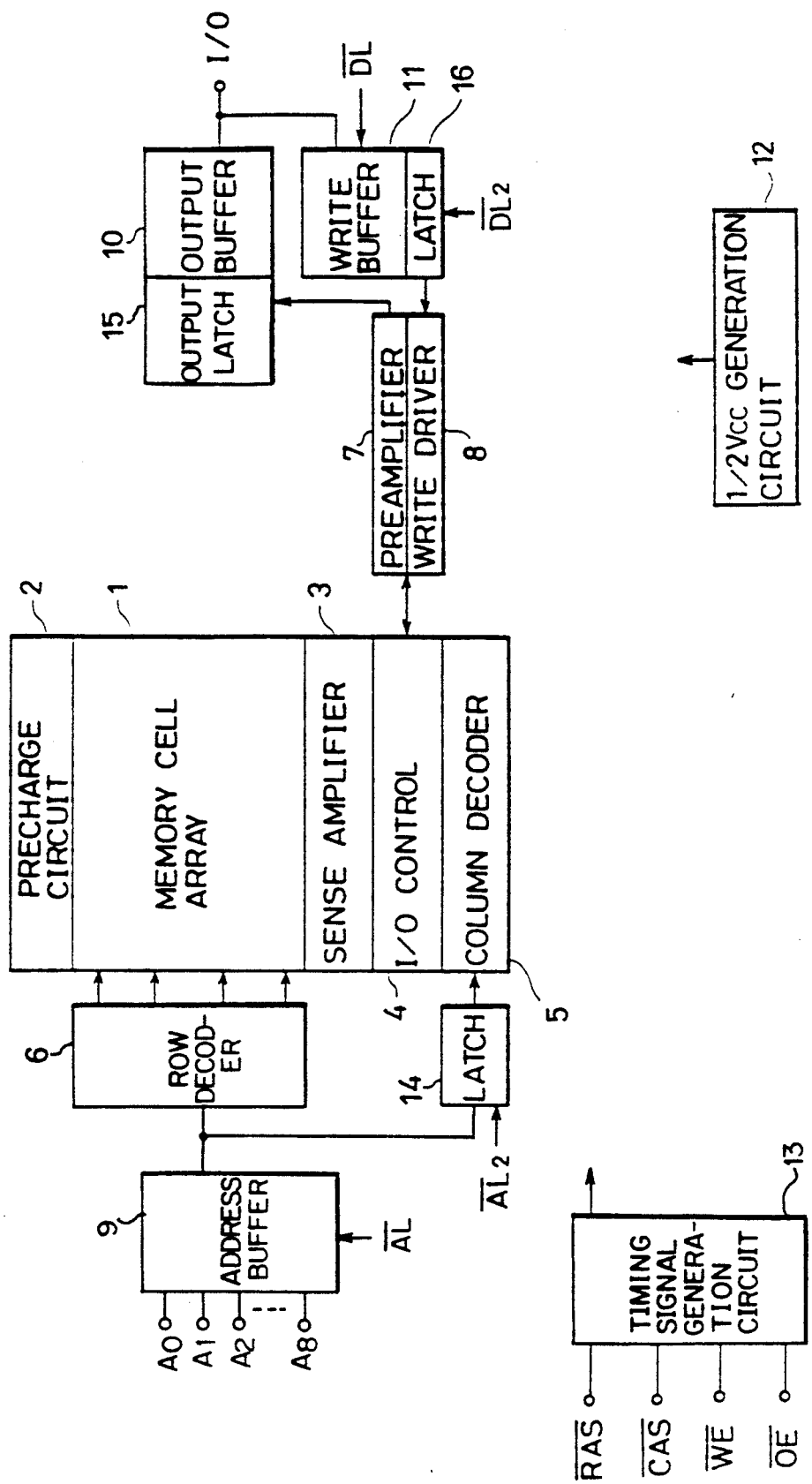
FIG. 11 is a block diagram showing a structure of a conventional dynamic type semiconductor memory device.

This figure corresponds to the block diagram of FIG. 11 showing a conventional semiconductor memory device, wherein points differing from the conventional one will be mainly described hereinafter.

Referring to FIG. 1, a column address data provided via address buffer 9 is applied to latch A 14a or latch B 14b via a switch circuit SW1. In response to the input of a signal $TS_1$ generated by a timing signal generation circuit 13, switch circuit SW1 provides the input column address data to either latch A or latch B. The column address data provided to latch A is supplied to column decoder A 5a in response to the change of signal $\overline{AL}$ 2-1. The column address data in latch B is provided to column decoder B 5b in response to the change of signal $\overline{AL}$ 2-2. The write data provided via I/O terminal is applied to switch circuit SW2 via write buffer 11. In response to the input of timing signal $TS_2$ provided from timing signal generation circuit 13, switch circuit SW2 provides the write data to write driver A 8a or write driver B 8b. The write data provided from write driver A or B is provided to the relative I/O control A 4a or I/O control B 4b via data bus IOA or IOB. In the reading operation, the read data provided from I/O control A or B is amplified by preamplifier A 7a or B 7b via data bus IOA or IOB to be provided to switch circuit SW3. In response to the input of timing signal $TS_3$ generated by timing signal generation circuit 13, switch circuit SW3 provides either of the data from preamplifier A or B to output latch 15.

As described above, the semiconductor memory device according to the present invention comprises two I/O controls, two column decoders, two preamplifiers, two write drivers and two latches with respect to memory cell array 1.

Figure 2:
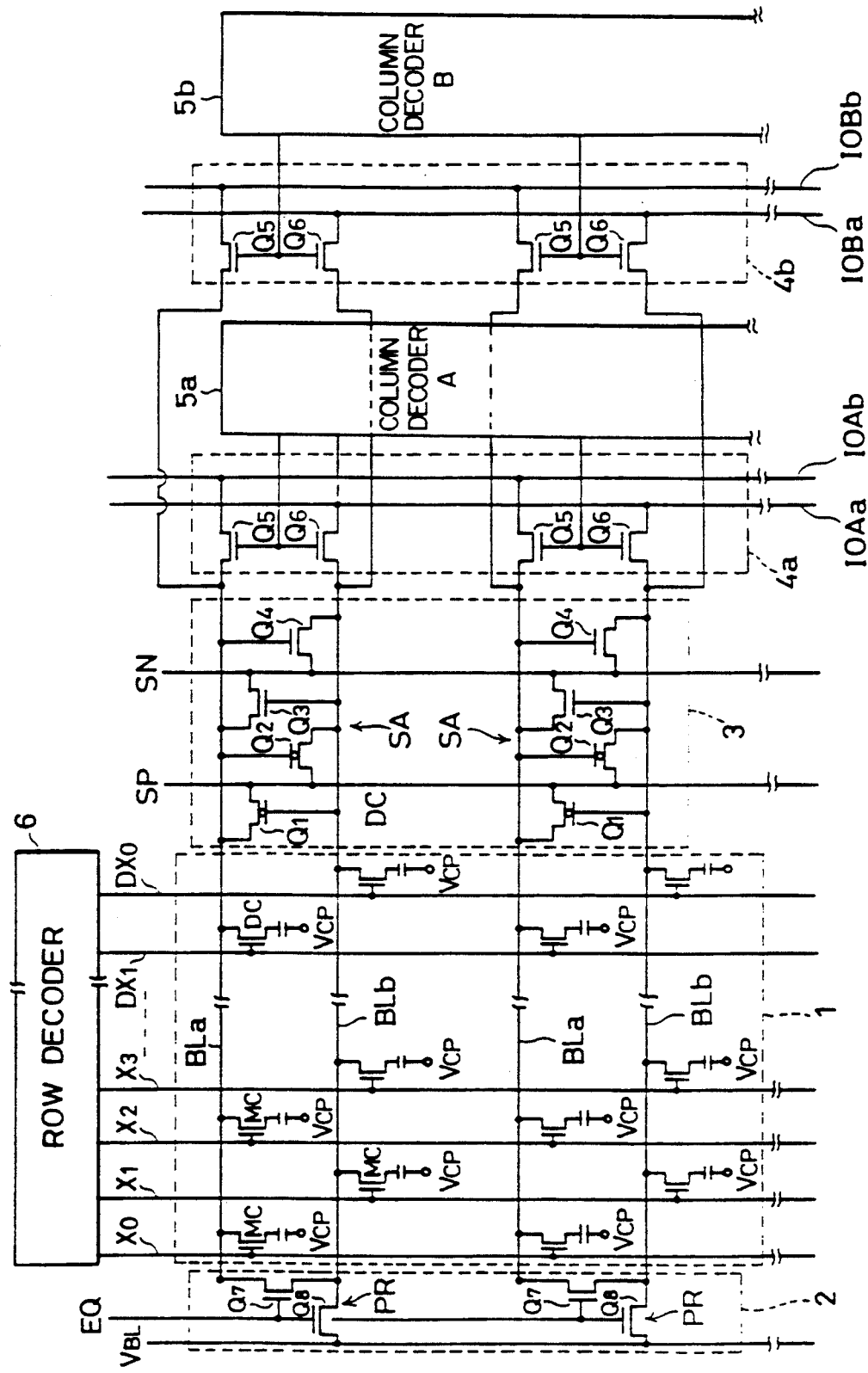
FIG. 2 is a circuit diagram specifically showing a structure of the periphery circuits around the memory cell array of FIG. 1.
Figure 12:
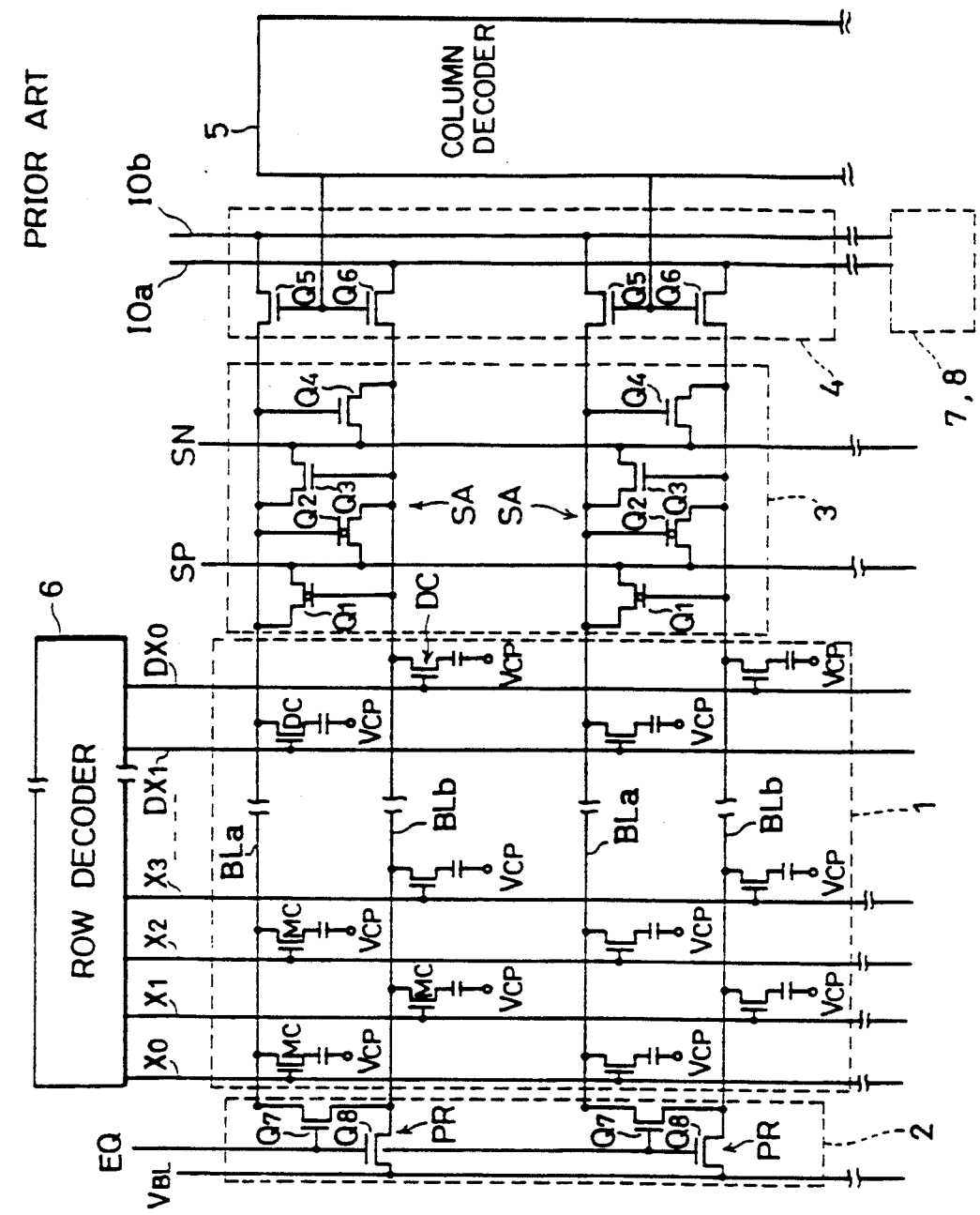
FIG. 12 is a circuit diagram showing a specific structure of a peripheral circuit of the memory cell array of FIG. 11.
Figure 13:
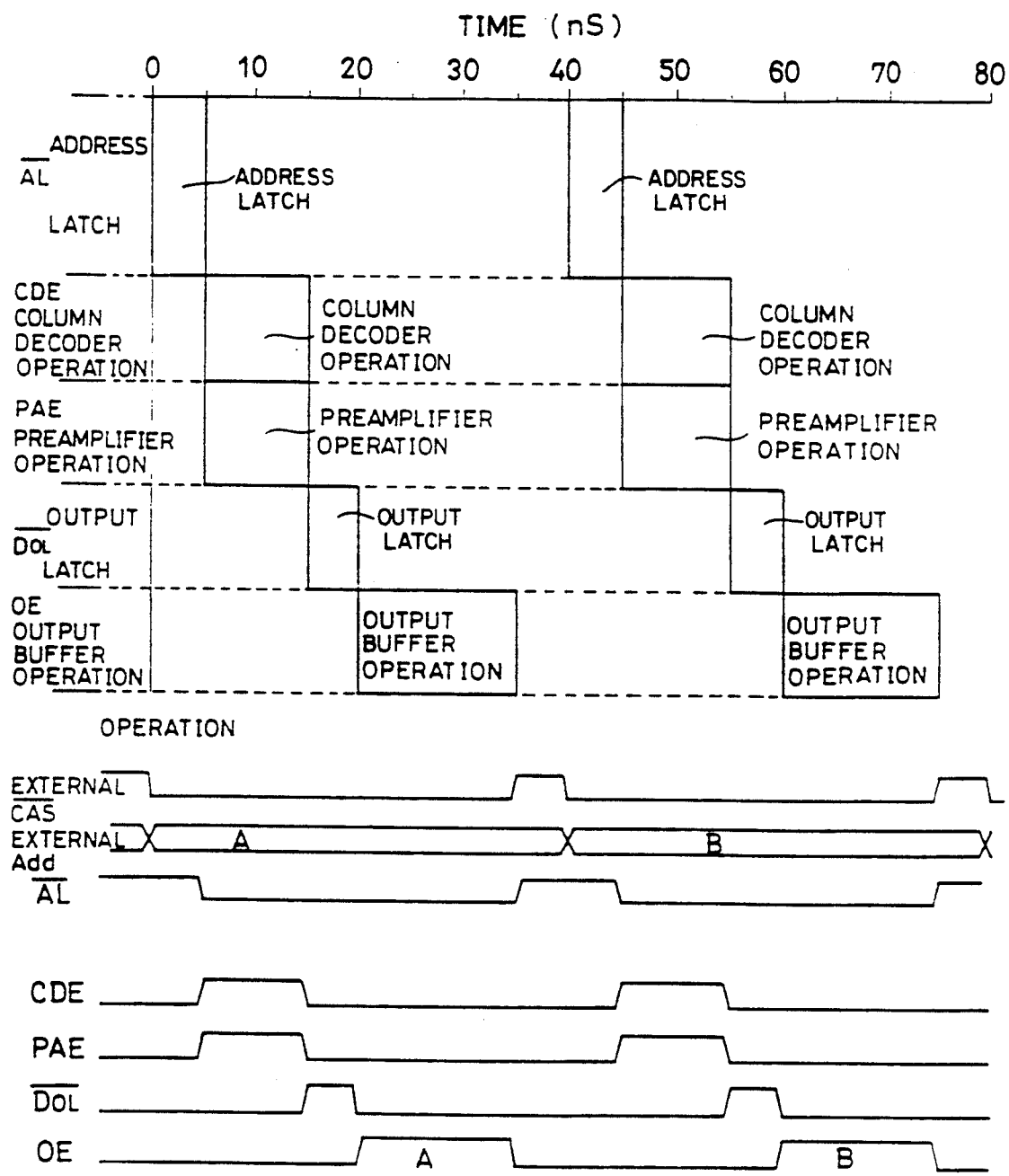
FIG. 13 is a diagram for explaining the operations of each circuit in association with time at a normal reading cycle after a row address is specified in a conventional dynamic type semiconductor memory device.
Figure 14:
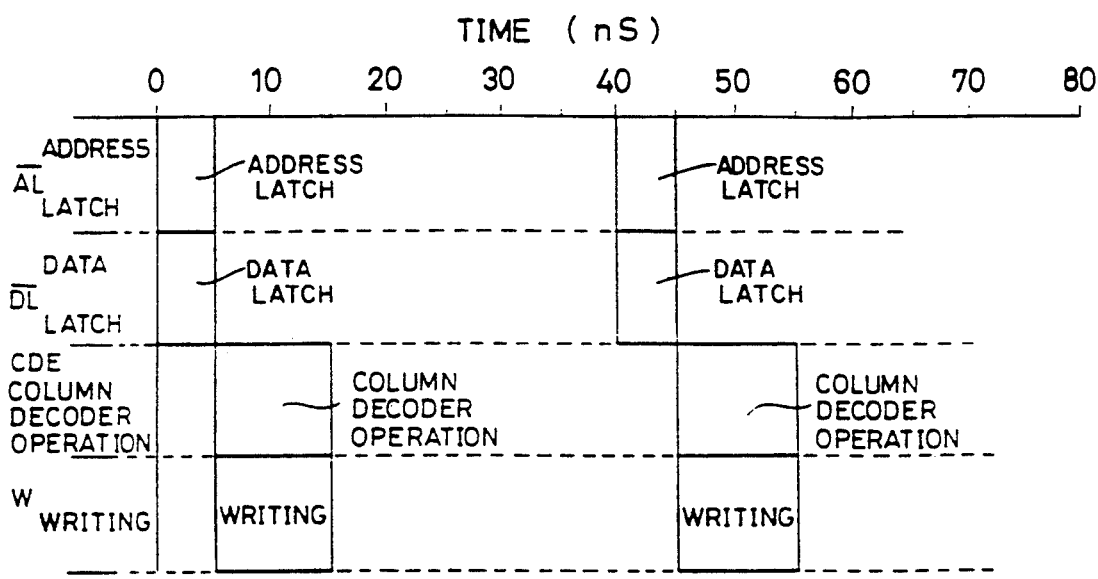
FIG. 14 is a diagram for explaining the operations of each circuit in association with time at a normal writing cycle after a row address is specified in a conventional dynamic type semiconductor memory device.
Figure 14:
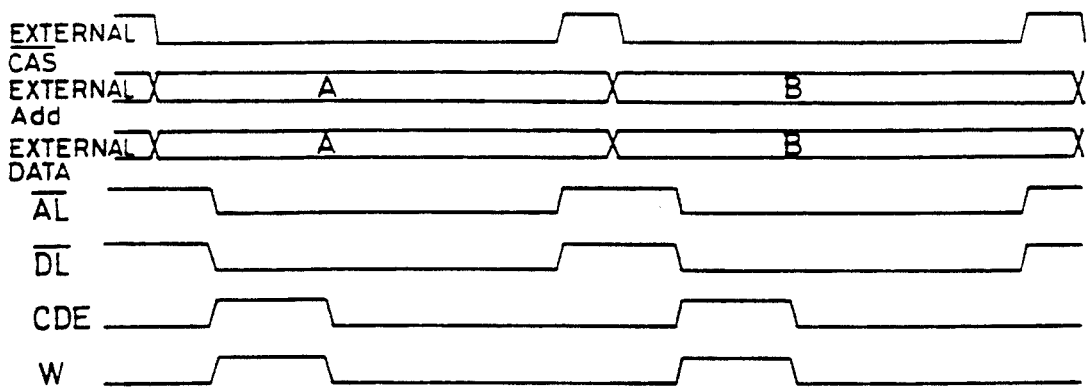
Figure 15:
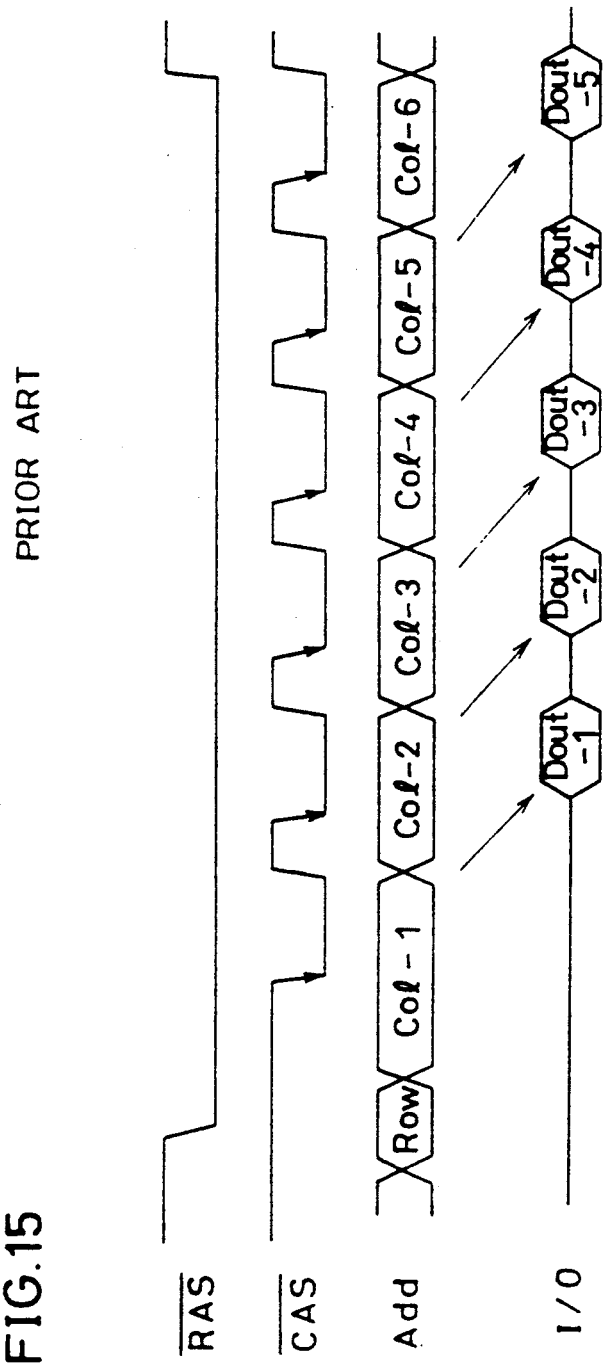
FIG. 15 is a timing chart showing the transition of each signal in page mode in a conventional dynamic type semiconductor memory device.
Figure 16:
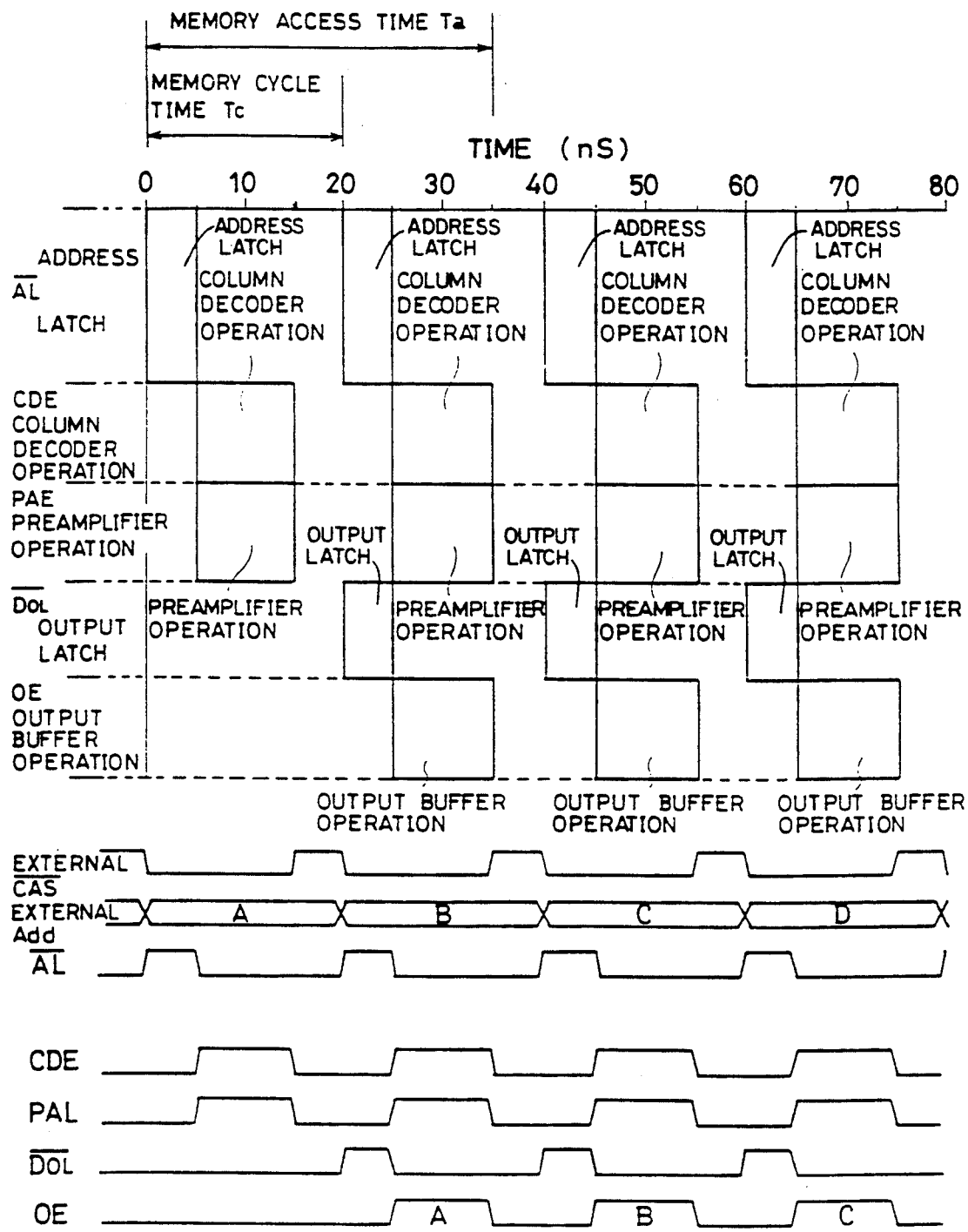
FIG. 16 is a diagram for explaining the operation of each circuit in association with time by pipe line processing at a normal reading cycle after a row address is specified in a conventional dynamic type semiconductor memory device.
Figure 17:
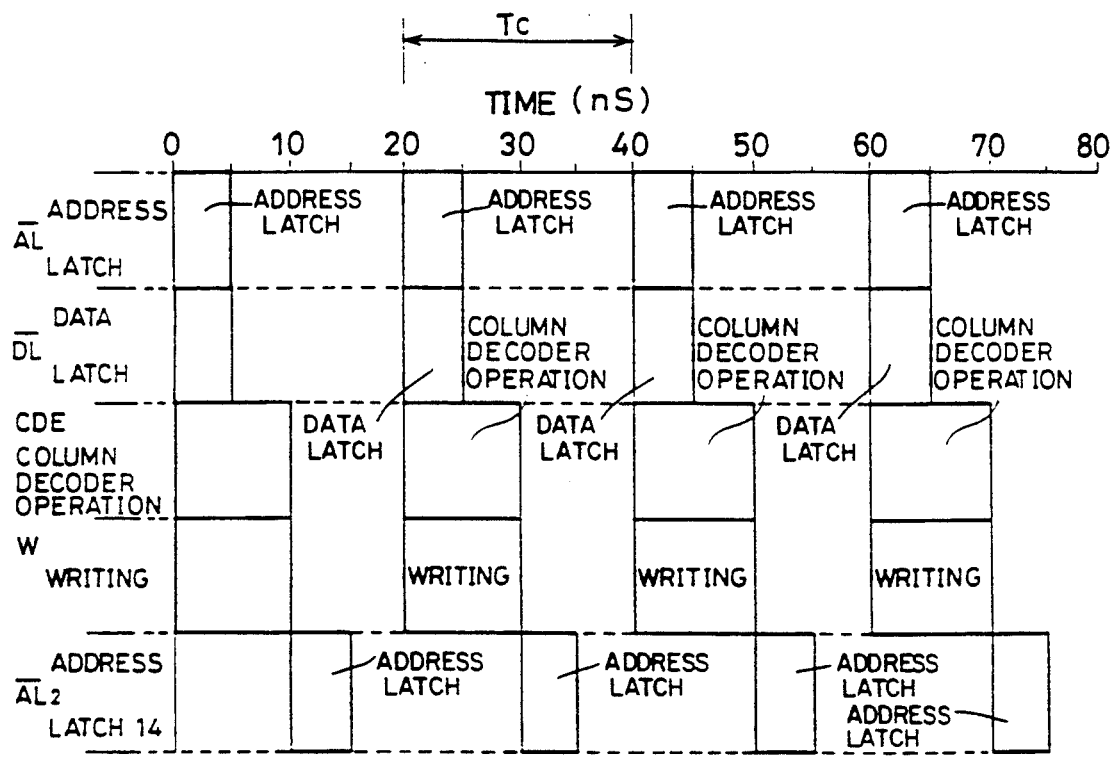
FIG. 17 is a diagram for explaining the operation of each circuit in association with time by pipe line processing at a normal writing cycle after a row address is specified in a conventional dynamic type semiconductor memory device.
Figure 17:
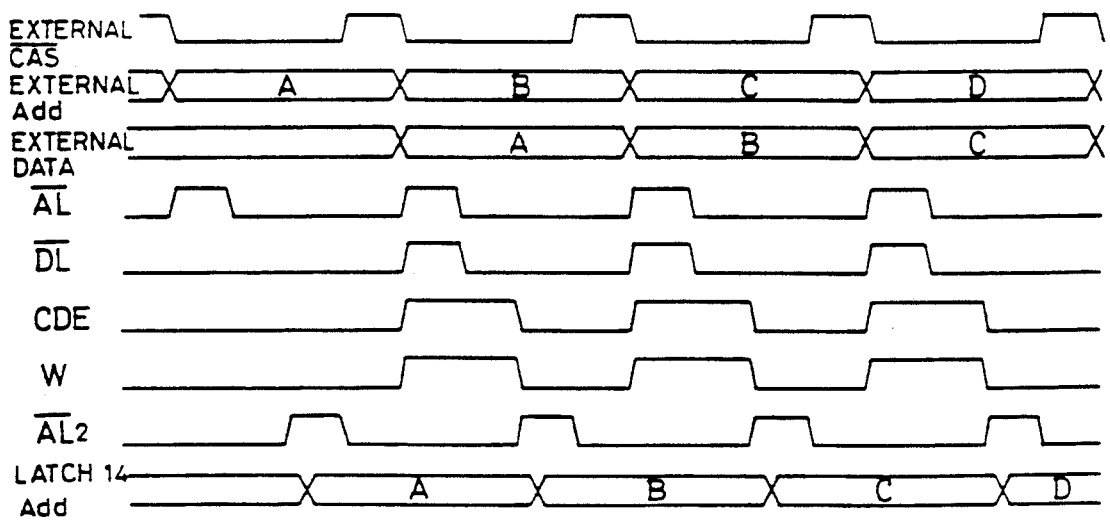
Figure 18:
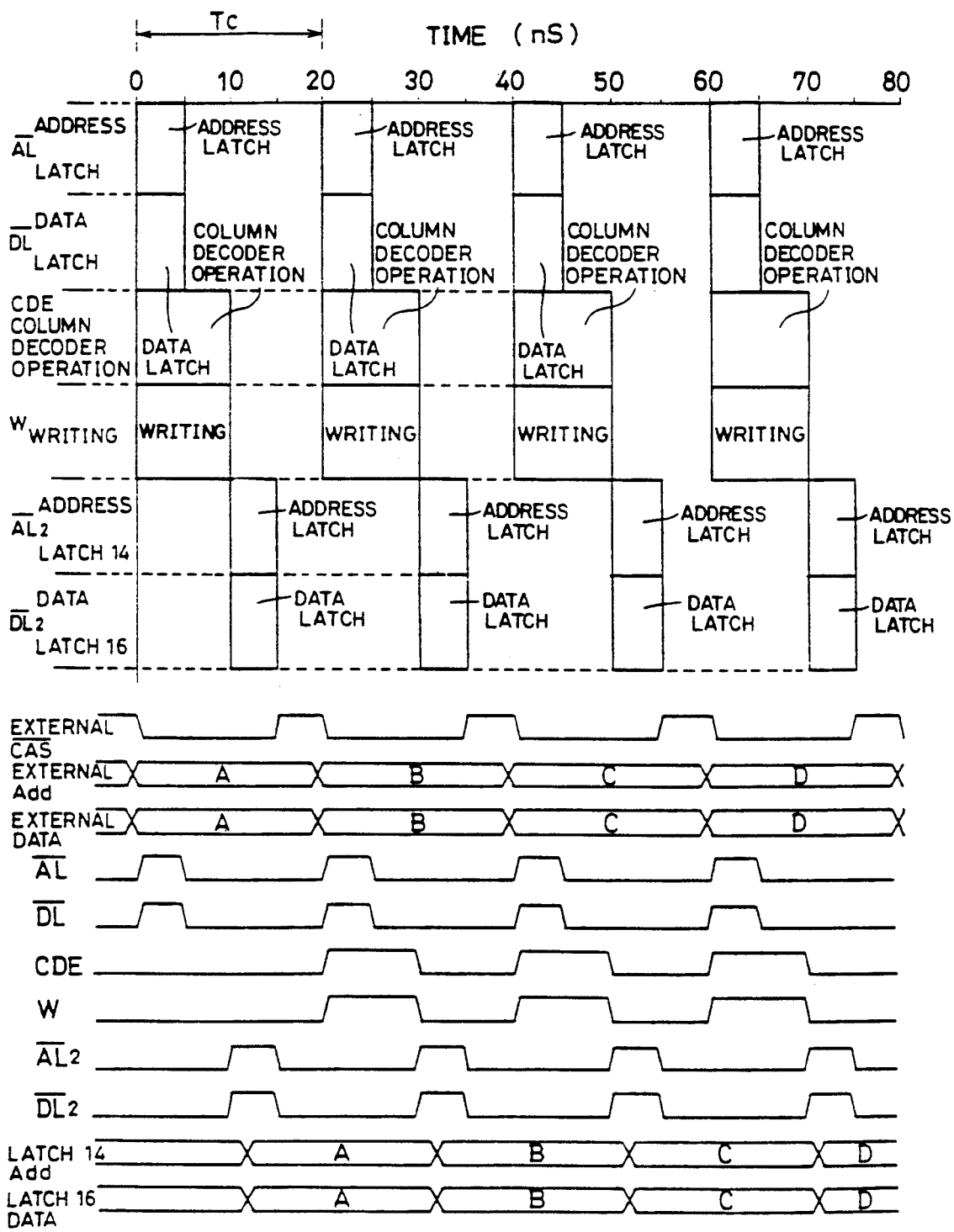
FIG. 18 is a diagram for explaining another example of the operation of each circuit in association with time by pipe line processing at a normal writing cycle after a row address is specified in a conventional dynamic type semiconductor memory device.
Figure 19:
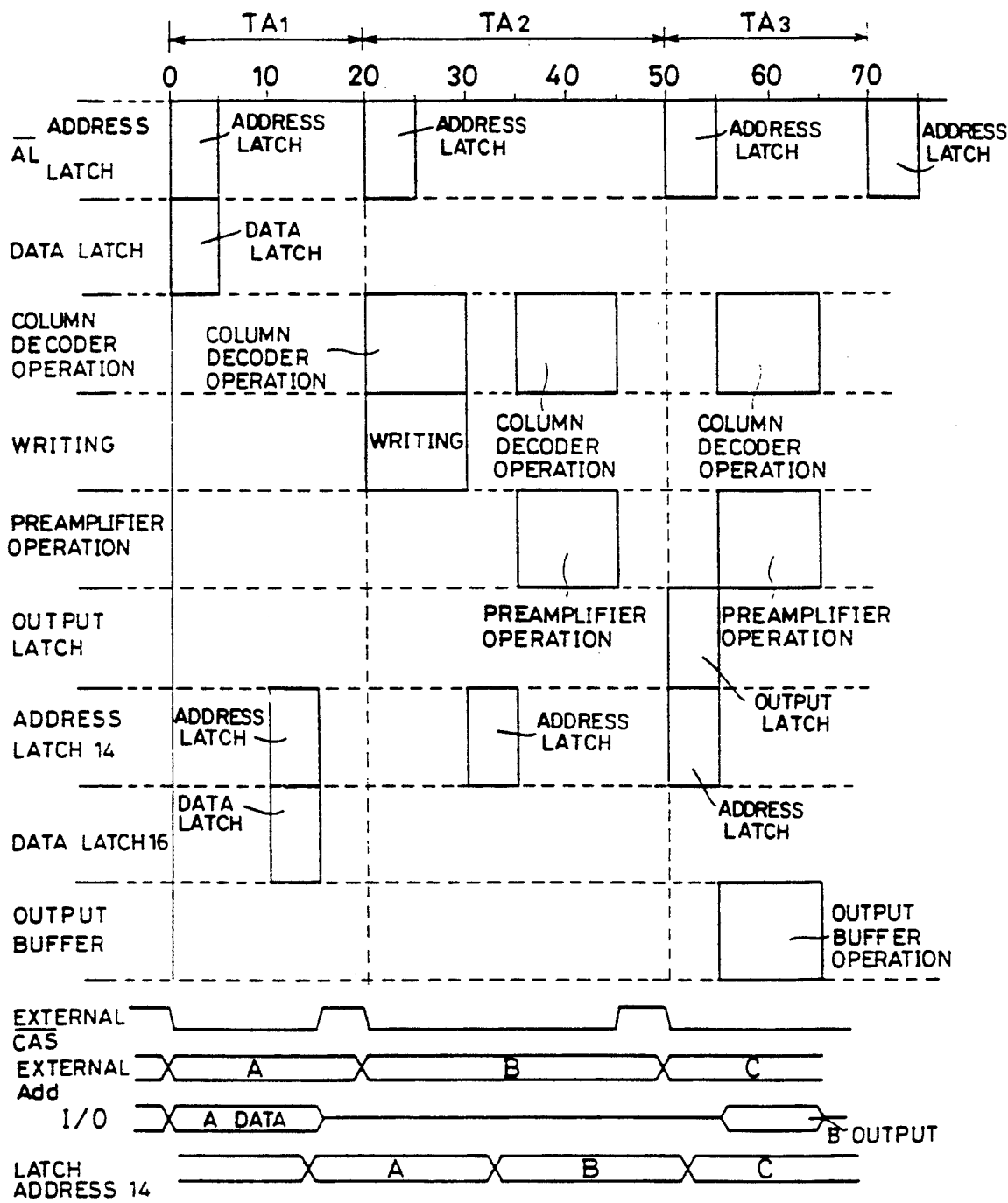
FIG. 19 is a diagram for explaining the operation of each circuit in association with time by pipe line processing where the writing cycle and the reading cycle are switched alternately after a column address is specified in a conventional dynamic type semiconductor memory device.

FIG. 2 is a circuit diagram showing a structure of the peripheral circuit of memory cell array 1 of FIG. 1, corresponding to FIG. 12.

The components differing from a conventional one will be mainly described hereinafter.

Referring to FIG. 2 where the structures of memory cell array 1, precharge circuit 2, and sense amplifier 3 are similar to those of a conventional one, two I/O controls and two column decoders are provided, as mentioned above. It is therefore possible to input column address data in parallel with column decoders A and B in the same one cycle. The column data provided to each column decoder will not affect the operation of the other column decoders since column decoders A and B only change the potentials of the gates of transistors $Q_5$ and $Q_6$ of each I/O control.

Figure 3:
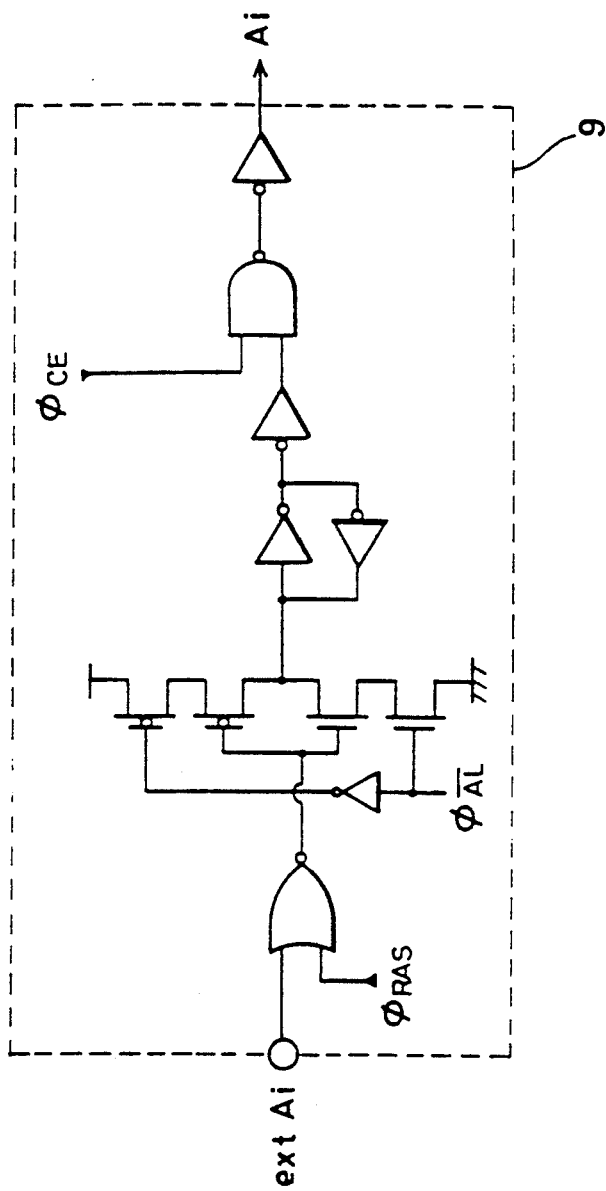
FIG. 3 is a circuit diagram showing the specific structure of the address buffer of FIG. 1.

FIG. 3 is a circuit diagram showing a specific structure of address buffer 9 of FIG. 1.

This circuit structure is basically similar to that of the semiconductor memory device shown in the conventional case.

Referring to FIG. 3, external address signal Ai is supplied to address buffer 9 in response to the input of signal $\phi$RAS related to signal RAS. In response to the change of signal $\phi\overline{AL}$ related to signal $\overline{AL}$, the address data is provided to switch circuit SW1 as address data Ai.

Figure 4:
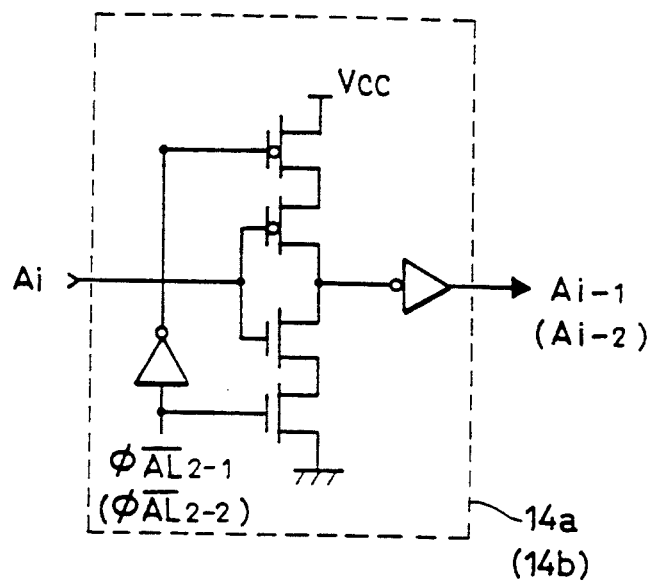
FIG. 4 is a circuit diagram showing a specific structure of latch A or B of FIG. 1.

FIG. 4 is a circuit diagram showing a specific structure of latch A14a or B14b of FIG. 1.

Referring to FIG. 4, column address data Ai provided from switch circuit SW1 is held in latch A (latch B) and also provided to column decoder A or B as column address information Ai-1 (Ai-2), in response to the change of signal $\phi\overline{AL}$ 2-1 ($\phi\overline{AL}$ 2-2) related to signal $\overline{AL}$ 2-1 ($\overline{AL}$ 2-2).

Figure 5:
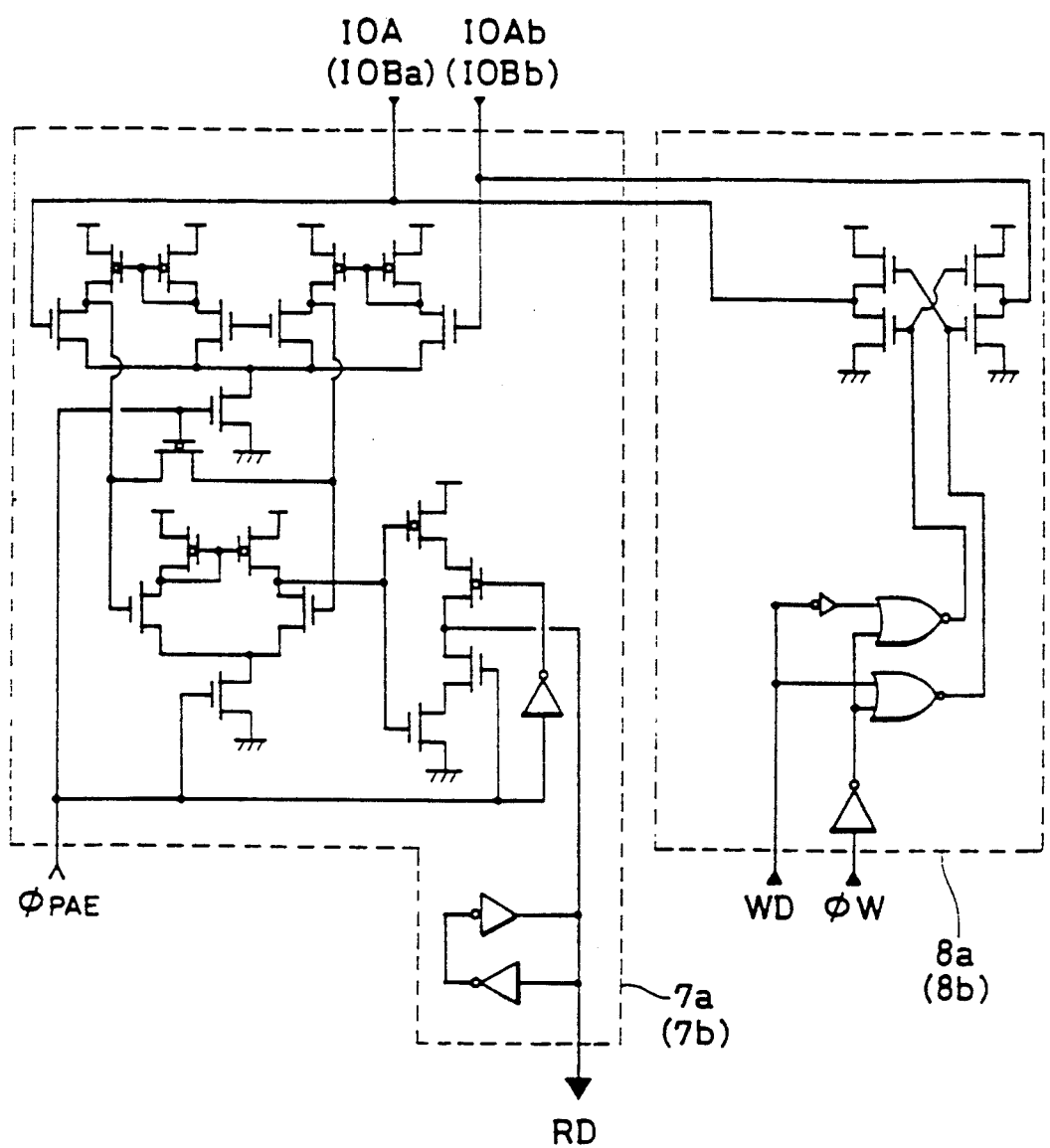
FIG. 5 is a circuit diagram showing a specific structure of preamplifier A and write driver A or preamplifier B and write driver B of FIG. 1.

FIG. 5 is a circuit diagram showing a specific structure of preamplifier A or B and write driver A or B of FIG. 1.

The read data applied to preamplifier A 7a or B 7b via data buses IOAa and IOAb or IOBa and IOBb from I/O control A or B is amplified in response to the change of signal $\phi$PAE related to signal PAE to be provided to switch circuit SW3 as read data RD.

Write data WD provided from switch circuit SW2 is applied to write driver A 8a or B 8b to be provided to I/O control A 4b or B 4b via a data bus in response to the change of signal $\phi$W related to signal W.

Figure 6:
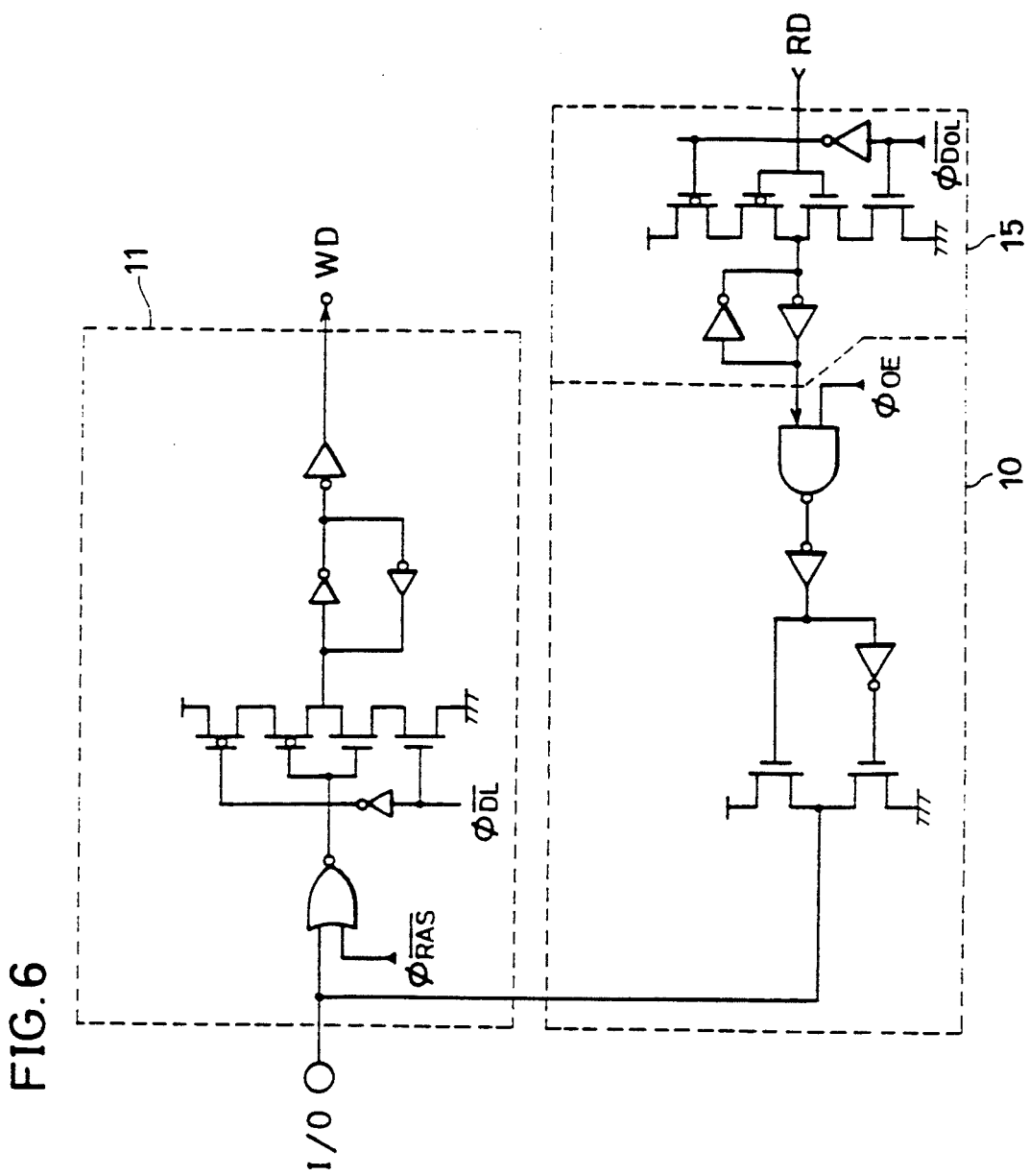
FIG. 6 is a circuit diagram showing a specific structure of the output buffer, the write buffer, and the output latch of FIG. 1.

FIG. 6 is a circuit diagram showing respective specific structures of write buffer 11, output buffer 10, and output latch 15 of FIG. 1.

The write data applied from I/O terminal is provided to write buffer 11 in response to the change of signal $\phi\overline{RAS}$ related to signal $\overline{RAS}$. In response to the change of signal $\phi\overline{DL}$ related to signal $\overline{DL}$, the write data held therein is provided to switch circuit SW2 as write data WD.

Read data RD provided from switch circuit SW3 is held in output latch 15 in response to the change of signal $\phi\overline{DOL}$ related to signal $\overline{DOL}$ to be provided from output buffer 10 via terminal I/O as the readout data in response to the change of signal $\phi$OE.

Figure 7:
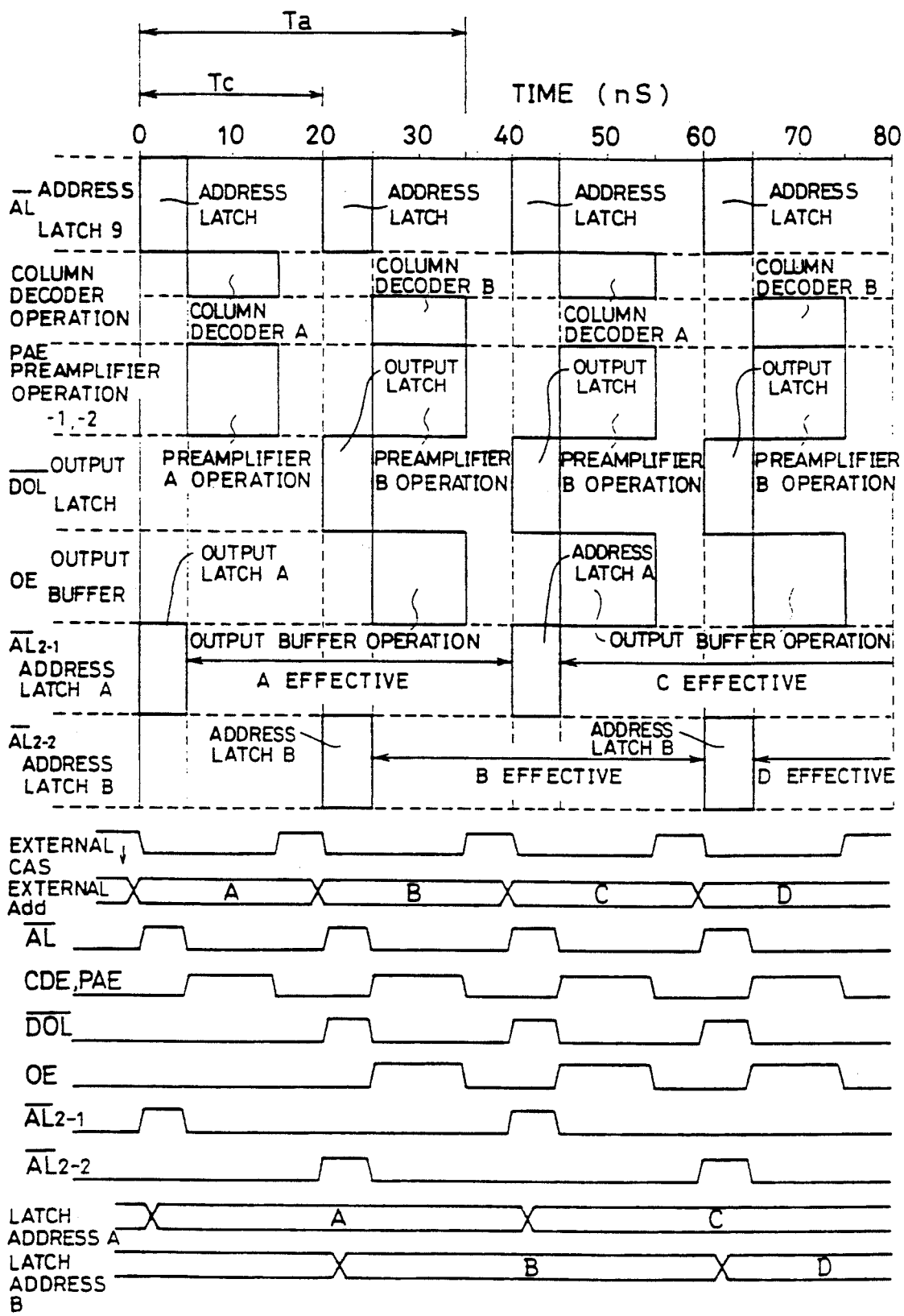
FIG. 7 is a diagram for explaining the operation of each circuit in association with time by pipe line processing in the normal reading cycle after a row address is specified according to an embodiment of the present invention.

FIG. 7 is a diagram for explaining the operation of each circuit in association with time by pipe line processing at a normal read cycle after a row address is specified according to an embodiment of the present invention.

In this embodiment, the operation of reading out charge information in a memory cell specified by a corresponding row address and column address is described, with row address data sequentially specified in the order of A, B, C and D.

When signals $\overline{AL}$ and $\overline{AL}$ 2-1 rise in response to the fall of external signal $\overline{CAS}$, external column address data A is provided to address buffer 9. Simultaneously, switch circuit SW1 is switched to select latch A, so that column address signal A is latched in latch A 14a (0-5 ns). Column decoder A then operates according to the value of column address data A supplied in latch A to select a desired bit line pair. Simultaneously, preamplifier A 7a operates, whereby charge information is read out from a memory cell specified by a desired row address and column address (5-15 ns). In the next cycle, the data read out by preamplifier A 7a is provided to and latched in output latch 15 via the switched switch circuit SW3 (20-25 ns). The read data held in output latch 15 is provided to an external source via I/O terminal by the operation of output buffer 10 (20-35 ns).

At the same time the data read out according to column address data A is provided to output latch 15, column address data B for the next read operation is similarly provided to address buffer 9. This time, switch circuit SW1 is switched to select latch B 14b, so that column address data B is held in latch B 14b (20-25 ns). Column decoder B and I/O control B are operated according to column address B, whereby data in a memory cell corresponding to the row address and column address data B is read into output latch 15 via preamplifier 7 and switch circuit SW3 (25-35 ns). Similarly, data in the memory cell corresponding to column address data C and D is read out sequentially to an external source with the latches, the column decoders, the I/O controls and the preamplifiers switched alternately.

In the present embodiment, memory access time Ta is 0-35 ns, whereas memory cycle time Tc is 0-20 ns. The memory cycle is reduced significantly with respect to the memory access time. Because two latches A and B are provided in this embodiment, column address data A is effective while being held in latch A during 0-40 ns, and column address data B is effective while being held in latch B during 20-60 ns, for example. In other words, the reading operation corresponding to a column address data is carried out when that column address data is effective. By doubling the provision of the components such as the latch and the column decoder, sufficient operation margin can be realized in pipe line processing of normal reading operation.

Figure 8:
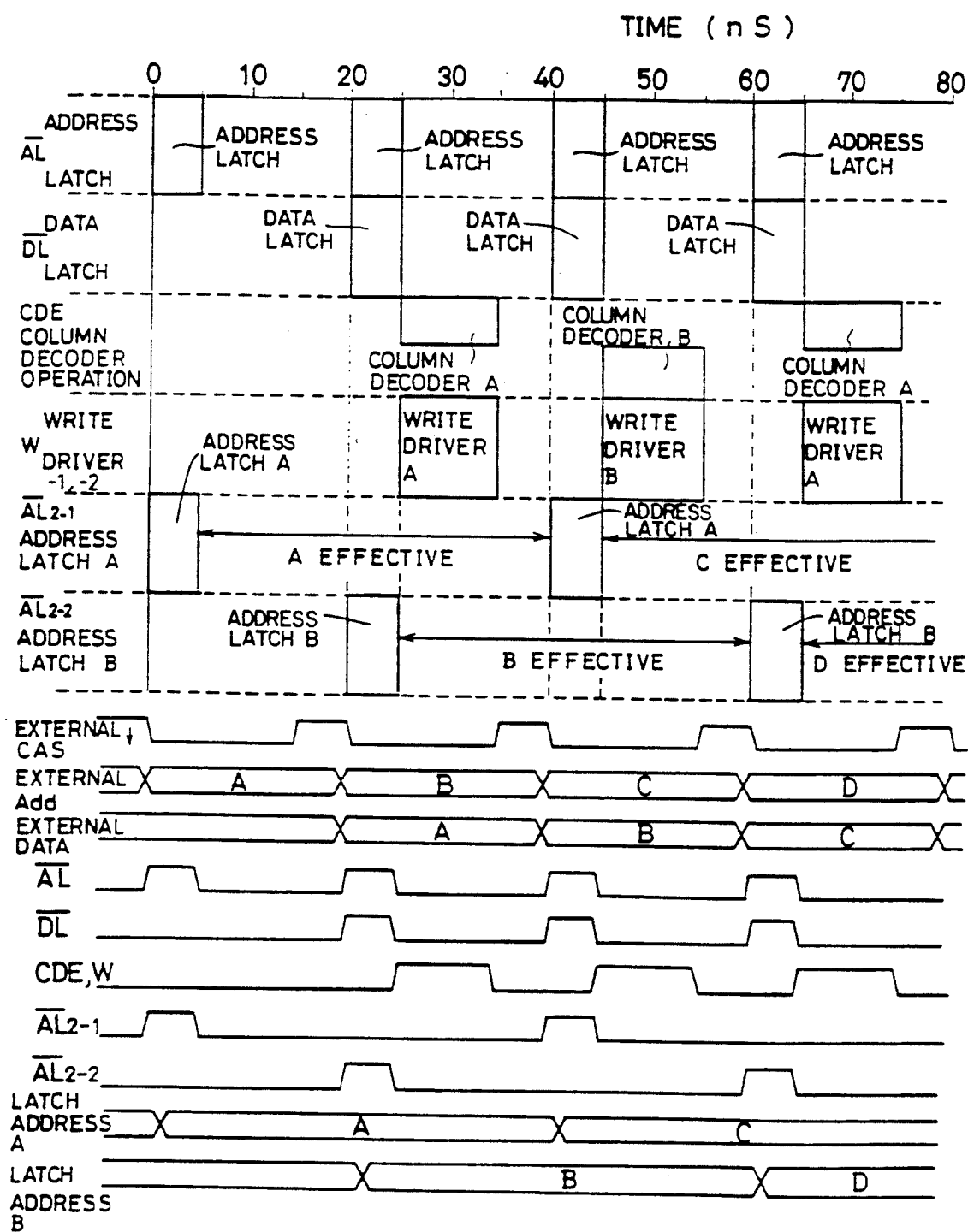
FIG. 8 is a diagram for explaining the operation of each circuit in association with time by pipe line processing of a normal writing cycle after a row address is specified according to an embodiment of the present invention.

FIG. 8 is a diagram for explaining the operation of each circuit in association with time by pipe line processing in a normal writing cycle after a row address is specified according to one embodiment of the present invention.

In response to the rise of signals $\overline{AL}$ and signal $\overline{AL}$ 2-1 according to the fall of external signal $\overline{CAS}$, external column address data A from address buffer 9 is supplied to and held in latch 14a via switch circuit SW1 (0-5 ns). Column address data A held in latch A remains therein until a subsequent column address data C is supplied, i.e. until time 40 ns. In response to the fall of external signal $\overline{CAS}$, external column address data B is provided to latch B 14b via address buffer 9 and the switched switch circuit SW1 (20-25 ns). Column address data B held in latch B remains therein until a subsequent column address D is fetched, i.e. until the time of 60 ns.

Simultaneously with the supply of column address data B, the write data to a memory cell corresponding to column address data A is provided to and held in write buffer 11 in response to the rise of signal $\overline{DL}$ (20-25 ns). Next, column decoder A operates according to column address data A held in latch A to turn on the transistor in the desired I/O control A for electrically connecting a data bus to a predetermined bit line pair. Simultaneously with the operation of column decoder A, the write data held in write buffer 11 is amplified by write driver A via switch circuit SW2 to be written into a predetermined memory cell as information charge (25-35 ns).

The write data corresponding to column address data B and et seq is sequentially written in the succeeding cycles in a manner similar to the process of write data for column address data A.

Figure 9:
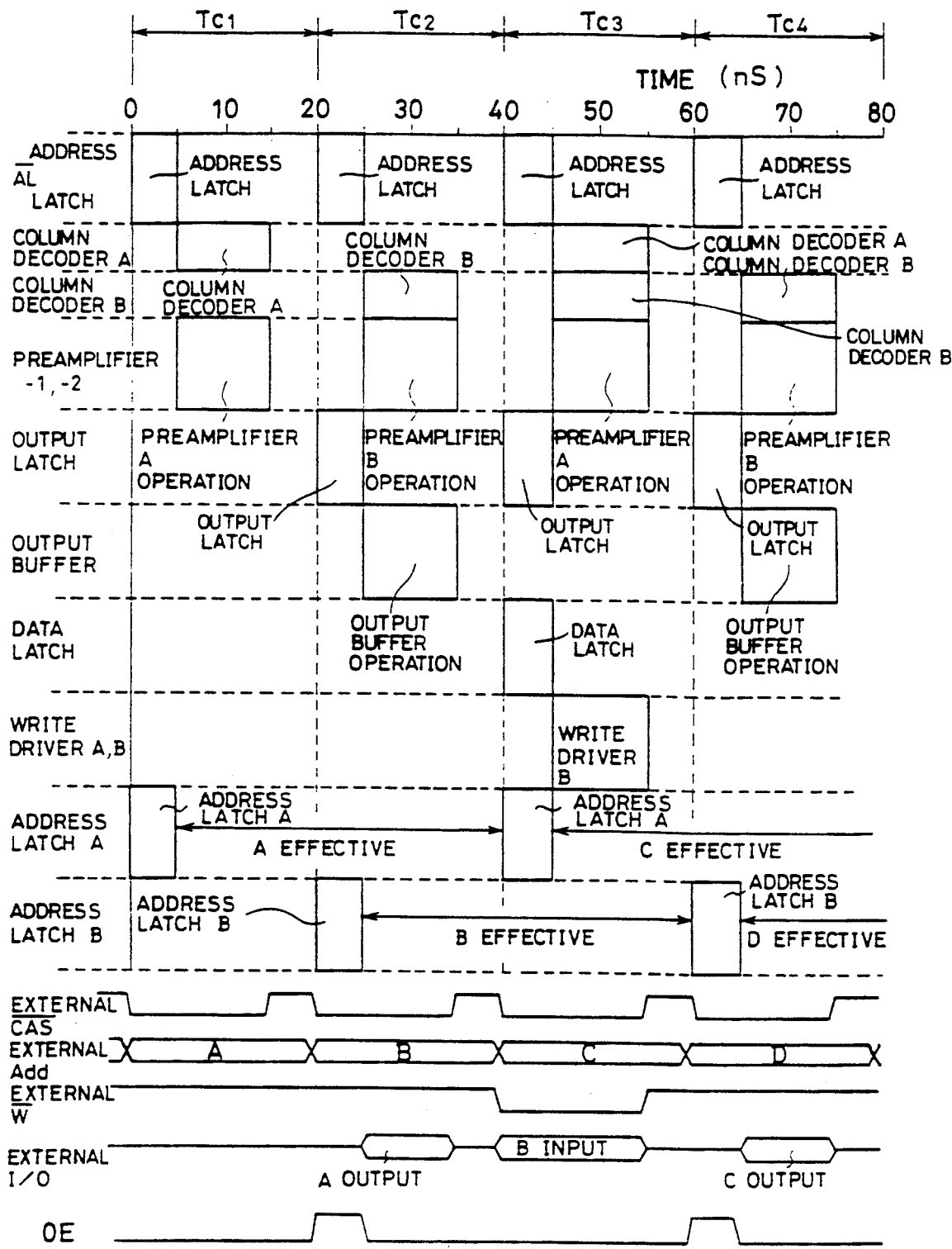
FIG. 9 is a diagram for explaining the operation of each circuits in association with time by pipe line processing in a cycle where reading operation and writing operation are alternately mixed after a row address is specified according to an embodiment of the present invention.

FIG. 9 is a diagram for explaining the operation of each circuit in association with time where a combination of reading and writing operation cycles are carried out by pipe line processing after the specification of a row address, according to an embodiment of the present invention.

In this embodiment, it is assumed that external column address data A, C and D are the address information for reading, and column address data B provided between column address data A and column address data C is the address information corresponding to the writing operation. The operation will be explained with the sequential changing cycles of TC1 (0-20 ns), TC2 (20-40 ns), TC3 (40-60 ns) and TC4 (60-80 ns) memory cycle time.

In response to the fall of external signal $\overline{CAS}$, external column address data A is provided to latch A via address buffer 9 and switch circuit SW1 (0-5 ns). Next, column decoder A and preamplifier A operate according to column address A held in latch A (5-15 ns). At the next cycle TC2, in response to the fall of external signal $\overline{CAS}$, external column address data B is provided to latch B via address buffer 9 and the switched switch circuit SW1 (20-25 ns). At this time, the data read out according to column address data A is provided to and held in output latch 15 via preamplifier A and switch circuit SW3 (20-25 ns). The operation of output buffer 10 causes the data corresponding to column address data A to be provided to an external source via terminal I/O (25-35 ns). At this time in cycle TC2, column decoder B and preamplifier B operate according to column address data B held in latch B for writing (25-35 ns).

In cycle TC3, the data in a memory cell corresponding to column address data B read out by the operation of column decoder B and preamplifier B for reading is provided to and held in output latch 15 via switch circuit SW3 (40-45 ns). However, output buffer 10 does not operate since signal OE controlling the output operation remains low in this cycle. The data in the memory cell corresponding to column address data B will not be read out to an external source. With the operation of output latch 15, the write data for writing into a memory cell corresponding to column address data B is provided to write buffer 11 in response to the fall of external write control signal $\overline{W}$ (40-45 ns). The data held in write buffer 11 is provided to write buffer B via the switched switch circuit SW2 to be amplified. This amplified write data is written into a corresponding memory cell by column decoder B operating according to column address data B held in latch B (45-55 ns). Although column decoder A and preamplifier A are both operated at this time, the potential change of the data bus for reading operation will not affect the potential change of the data bus for writing operation because the data bus used for the relevant operations are not the same.

In cycle TC3, external column address C for the next reading operation is held in latch A (40-45 ns).

In cycle TC4, reading operation will be carried out according to column address data C held in latch A of the previous cycle.

In accordance with an embodiment of the present invention, each memory cycle time is 0-20 ns even in the case where reading and writing operation are mixed. The memory cycle time does not differ from that in the case where reading operation or writing operation continue.

Figure 10:
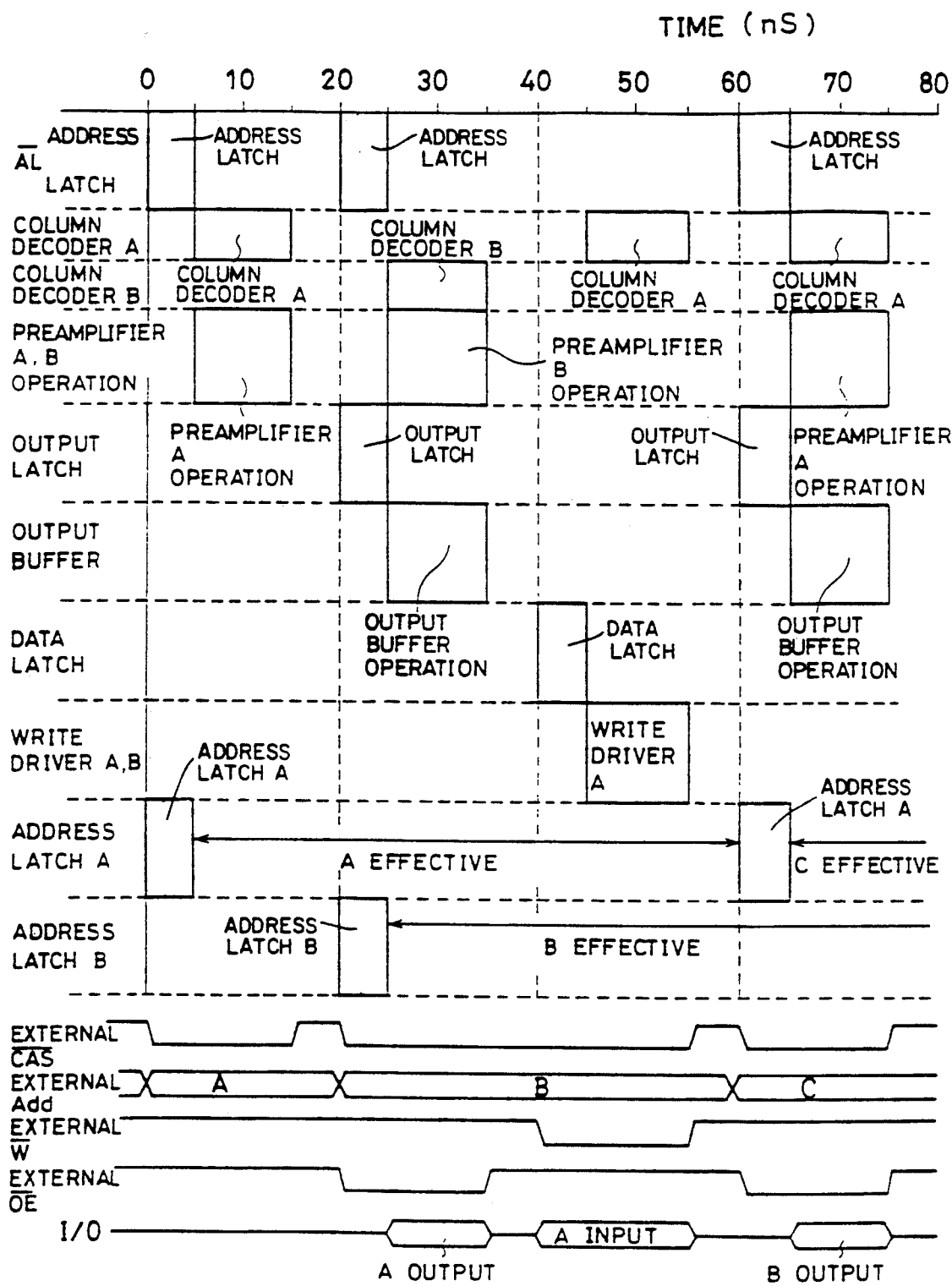
FIG. 10 is a diagram for explaining the operation of each circuit in association with time by pipe line processing at a read modify write cycle after a row address is specified according to an embodiment of the present invention.

FIG. 10 is a diagram for explaining the operation of each circuit in association with time by pipe line processing of a read-modify-write cycle according to an embodiment of the present invention.

In this embodiment, the information charge in a memory cell corresponding to column address data A is read out, and then a new data is provided to this memory cell, followed by the reading operation of a memory cell corresponding to data succeeding column address data B and C.

The reading operation of column address A is carried out by the read cycle at the time period of 0-35 ns, as described above. In this embodiment, the latching of a write data is carried out, after the termination of the output buffer operation of the data corresponding to column address data A (40-45 ns), i.e. from the time period of 40 ns where a new data is to be written. More specifically, in response to the fall of external write control signal $\overline{W}$, a write data is provided to and held in write buffer 11 from I/O terminal. Then, column decoder A and write driver A are operated to write data into a memory cell corresponding to column address data A to complete the modify cycle. Then, the write operation of the memory cell corresponding to column address data B is commenced. This column address B is held in latch B in response to the fall of external signal $\overline{CAS}$ at the time of 20 ns. According to column address data B held therein, information of the memory cell corresponding to column address data B is read out from 60 ns.

This means that the modify cycle, requiring a time period of 20-60 ns, can be carried out with no influence upon the reading operation of the preceding cycle or the succeeding cycle.

The effective time period for latching the column address is 0-60 ns to cover the read cycle to the termination of the modify cycle.

Although the present invention is applied to a dynamic type semiconductor memory device in the above described embodiments, the present invention is also applicable to other memory devices, such as a static type semiconductor memory device (SRAM) and an EEPROM memory device.

Although the present invention is employed in pipe line processing of a page mode for a dynamic type semiconductor memory device, the present invention is not limited to the page mode, and the concept of the present invention can be similarly applied to random read/write operation.

Although two components of decoders and the like are provided in the above described embodiment, three or more components can be provided. Furthermore, the concept of the present invention can be applied to the provision of a plurality of row decoders.

Because at least two column address holding means and column address specify means are provided in the present invention, the memory cycle time can be reduced to realize high speed memory processing operation even in the case where reading and writing operation are mixed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a plurality of memory cells arranged in a matrix of rows and columns for writing information into a memory cell corresponding to a specified row and column, and for reading information from a corresponding memory cell, comprising:

row address input means for entering a row address,
a row address specify means for specifying said input row address,
column address input means for inputting sequentially a column address with respect to said input row address,
first column address holding means for holding one of said input column address,
first column address specify means for specifying said column address held by said first column address holding means,
second column address holding means for holding a column address input succeeding said column address held by said first column address holding means,
second column address specify means for specifying said column address held by said second column address holding means,
operation means for carrying out writing or reading operation of information with respect to a memory cell corresponding to specified row and column addresses, and
control means for operating said operation means according to said first row and column addresses specified by said row address specify means and said first column address specify means, for enabling said second column address holding means before the termination of the operation of said operation means according to said specified first row and column addresses, and for operating said operation means according to said second row and column addresses specified by said row address specify means and said second column address specify means after the termination of the operation of said operation means according to said first row and column addresses.

2. The semiconductor memory device according to claim 1, wherein said first and second column address holding means comprise first and second latch circuits each connecting to said column address input means, each of said latch circuits being switched by a switch circuit.

3. The semiconductor memory device according to claim 1, wherein
said row address specify means comprises a row decoder, and
said first and second column address specify means comprise first and second column decoders.

4. The semiconductor memory device according to claim 1, wherein said operation means comprises
first and second input/output controllers connected to a plurality of bit lines connected to said memory cell,
first and second preamplifiers connected to each of said input/output controllers, and
first and second write drivers connected to each of said input/output controllers.

5. The semiconductor memory device according to claim 4, wherein
said input/output controllers and said write drivers are enabled at the time of writing information, and
said input/output controllers and said preamplifiers are enabled at the time of reading information.

6. The semiconductor memory device according to claim 1, wherein the operation of said operation means comprises writing or reading operation in pipe line processing.

7. The semiconductor memory device according to claim 1, said semiconductor memory device comprising a dynamic type semiconductor memory device,
wherein said operation of said operation means comprises read and write operation in page mode processing.

8. A semiconductor memory device having a plurality of memory cells arranged in a matrix manner of rows and columns, for writing information into a memory cell corresponding to a specified row and column, and for reading out information held in the corresponding memory cell, comprising:
a row address buffer for inputting a row address,
a row decoder for specifying said input row address,
a column address buffer for inputting sequentially column address with respect to said input row address,
a first column address latch for holding one of said input column address,
a first column decoder for specifying a column address held by said first column address holding means,
a second column address latch for holding a column address input succeeding said column address held by said first column address latch,
a second column decoder for specifying a column address held by said second column address latch,
a write driver for writing information to a memory cell corresponding to specified row and column addresses,
a preamplifier for reading out information with respect to a memory cell corresponding to specified row and column addresses, and
a controller for operating said write driver or preamplifier according to first row and column addresses specified by said row decoder and said first column decoder, for enabling said second column address latch before the termination of the operation according to said first row and column addresses, and for operating said write driver or preamplifier according to second row and column addresses specified by said row decoder and second column decoder after the termination of the operation according to said first row and column addresses.

9. A method of controlling information reading operation in a semiconductor memory device including operation cycles based on a plurality of consecutive memory cycle times, said method comprising the steps of:
i) at a first operation cycle
latching an input column address, and
operating a first column decoder and a first preamplifier according to said latched column address,
ii) at a second operation cycle
latching a column address input for the next reading operation,
operating a second column decoder and a second preamplifier according to said latched column address, and holding in an output latch a data read out by the preceding operation cycle, and providing said held data via an output buffer.

10. A method of controlling information reading operation in a semiconductor memory device an operation cycle based on a plurality of consecutive memory cycle times, with a cycle of writing operation following reading operation, said method comprising the steps of:
i) at a first operation cycle, latching an input column address, and operating a first column decoder and a preamplifier according to said latched column address,
ii) at a second operation cycle, latching a column address input for the subsequent writing, and holding a data read out by the preceding operation cycle in an output latch, and providing said held data via an output buffer,
iii) at a third operation cycle, operating a second column decoder according to a column address for writing which is latched at the preceding operation cycle, and latching a data for writing to write said latched data by operating a write driver circuit.

11. A method of controlling information read/write operation in a semiconductor memory device operated in one of read, modify, and write cycles, comprising the steps of:
i) at a first operation cycle
latching an input first column address,
operating a first column decoder and a preamplifier according to said latched first column address,
ii) at a second operation cycle
latching a second column address input for a succeeding reading,
holding a first data read out by the preceding operation cycle in an output latch,
providing said held first data via an output buffer,
iii) at a third operation cycle
latching a second data for writing to write said latched data by the operation of a write driver circuit,
iv) at a fourth operation cycle
operating a second column decoder according to a second column address for reading which is latched by said second operation cycle,
holding in an output latch a third data read out, providing said held data via an output buffer.

12. A method of operating a semiconductor memory device having a plurality of memory cells arranged in a matrix of rows and columns for writing information into a memory cell corresponding to a specified row and column and for reading out information held in a corresponding memory cell, said method comprising the steps of:

inputting a row address, specifying said input row address, inputting a column address with respect to said input row address, holding an input column address, specifying a held column address, carrying out reading operation of information with respect to a memory cell corresponding to first row and column addresses specified by a row address specify means and a first column address specify means, holding separately a column address input succeeding said held column address holding said read out information, and specifying said separately held column address, and carrying out information reading operation with respect to a memory cell corresponding to said specified column and said preceding held column address, and providing said held information.

* * * * *